(12) United States Patent
Wilson

(10) Patent No.: US 7,482,869 B2
(45) Date of Patent: Jan. 27, 2009

(54) HIGH EFFICIENCY AMPLIFICATION

(75) Inventor: Martin Paul Wilson, Cambridgeshire (GB)

(73) Assignee: Nujira Limited, Cambridge (GB)

( * ) Notice: Subject to any disclaimer, the term of this patent is extended or adjusted under 35 U.S.C. 154(b) by 0 days.

(21) Appl. No.: 11/161,854

(22) Filed: Aug. 19, 2005

(65) Prior Publication Data
US 2006/0028271 A1 Feb. 9, 2006

Related U.S. Application Data

(63) Continuation of application No. PCT/GB2003/004507, filed on Oct. 17, 2003.

(30) Foreign Application Priority Data

Feb. 19, 2003 (GB) ................... 0303826.2

(51) Int. Cl.
 *H03F 1/00* (2006.01)
(52) U.S. Cl. ..................... 330/199; 330/127
(58) Field of Classification Search ................. 330/127, 330/147, 199
 See application file for complete search history.

(56) References Cited

U.S. PATENT DOCUMENTS

| 4,367,437 A * | 1/1983 | Mikami ................. 323/349 |
| 5,363,057 A * | 11/1994 | Furuno ................. 330/129 |
| 5,898,342 A | 4/1999 | Bell |
| 6,025,754 A | 2/2000 | Czora |
| 6,141,541 A | 10/2000 | Midya et al. ............. 455/91 |
| 6,300,826 B1 | 10/2001 | Mathe et al. |
| 6,583,664 B2 | 6/2003 | Mathe et al. |
| 6,661,210 B2 | 12/2003 | Kimball et al. |
| 6,661,217 B2 | 12/2003 | Kimball et al. |
| 6,710,646 B1 | 3/2004 | Kimball |
| 6,788,151 B2 * | 9/2004 | Shvarts et al. ............. 330/297 |
| 6,792,252 B2 | 9/2004 | Kimball et al. |
| 2002/0030543 A1 | 3/2002 | French |
| 2003/0062950 A1 * | 4/2003 | Hamada et al. ............. 330/127 |
| 2003/0137344 A1 | 7/2003 | Kimball et al. |
| 2003/0137355 A1 * | 7/2003 | Lin ..................... 330/290 |

FOREIGN PATENT DOCUMENTS

| GB | 2366461 A | 3/2002 |
| JP | 57068908 A | 4/1982 |
| JP | 5-267941 A | 10/1993 |
| WO | WO-01/86806 A2 | 11/2001 |
| WO | WO-03/054559 A2 | 7/2003 |
| WO | WO-03/063341 A1 | 7/2003 |

* cited by examiner

*Primary Examiner*—David H Vu
*Assistant Examiner*—Tung X Le
(74) *Attorney, Agent, or Firm*—Novak Druce DeLuca + Quigg LLP

(57) ABSTRACT

A radio frequency amplification stage including an amplifier for receiving an input signal to be amplified and a power supply voltage; and a power supply voltage stage for supplying said power supply voltage, including a circuit for providing a reference signal representing the envelope of the input signal; a circuit for selecting one of a plurality of supply voltage levels in dependence on the reference signal; and a circuit for generating an adjusted selected power supply voltage, including an ac amplifier for amplifying a difference between the reference signal and one of the selected supply voltage level or the adjusted selected supply voltage level, and a summer for summing the amplified difference with the selected supply voltage to thereby generate the adjusted supply voltage.

43 Claims, 8 Drawing Sheets

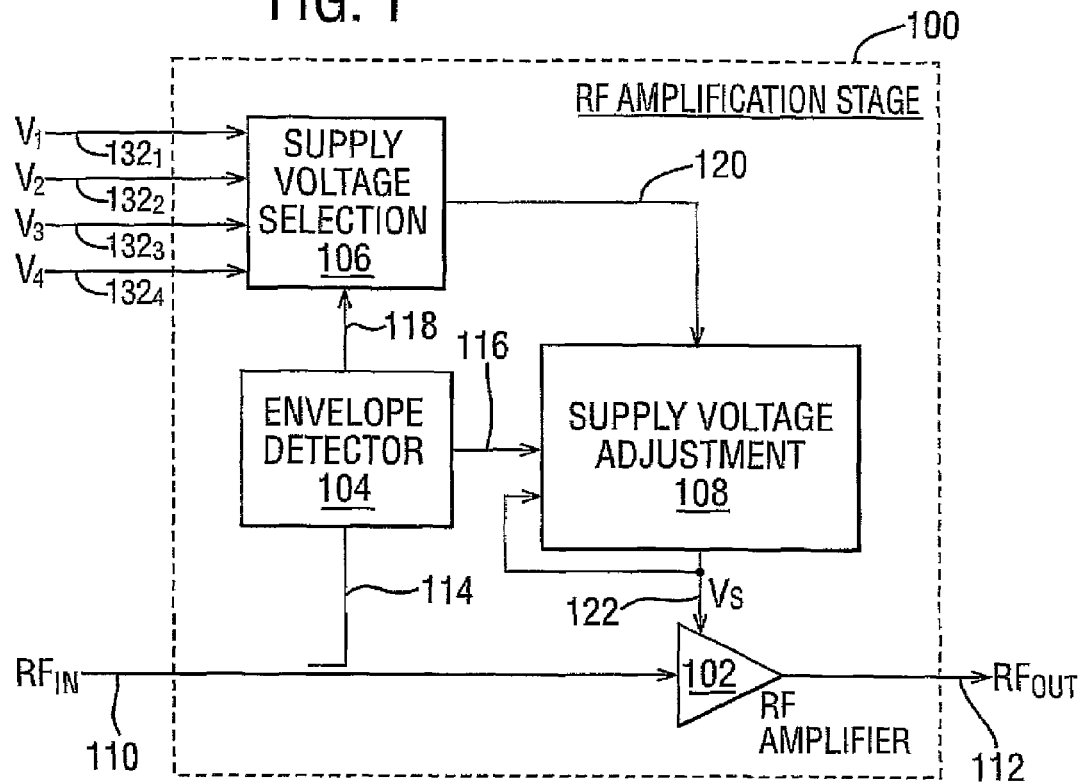
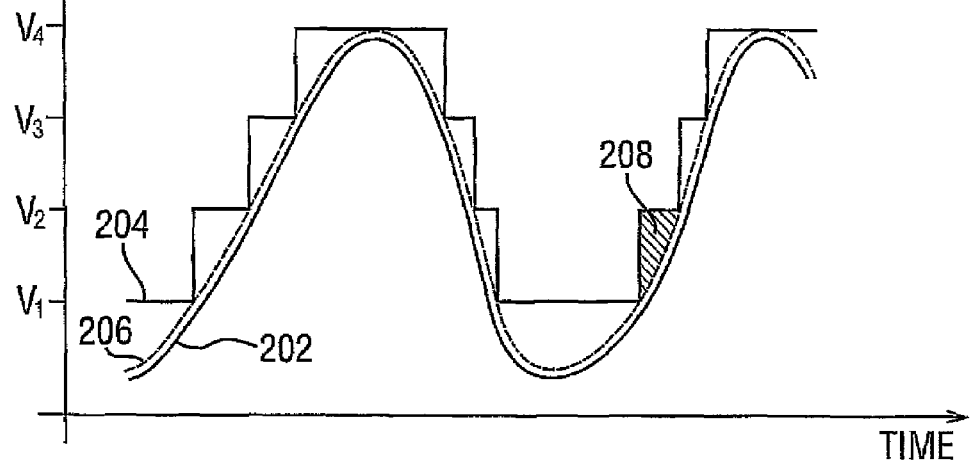

HIGH EFFICIENCY AMPLIFICATION

CROSS-REFERENCE TO RELATED APPLICATIONS

The present application is a National Stage filing under 35 U.S.C. 371 of International Application No. PCT/GB2003/004507 filed 17 Oct. 2003 which claims priority to GB Application No. 0303826.2 filed 19 Feb. 2003; the entire disclosures of which are incorporated herein by reference.

FIELD OF THE INVENTION

The present invention relates to the control of a supply voltage, in an arrangement in which the supply voltage is selectable. The invention is particularly but not exclusively concerned with the control of a supply voltage to an amplifier such as a broadband radio frequency (RF) amplifier having a wide dynamic range.

BACKGROUND TO THE INVENTION

Transistor amplifiers have a peak efficiency for a particular input power that is a function of geometry (i.e. circuit components and layout), load and supply voltage. In conventional radio frequency (RF) power amplification these characteristics are fixed based on the peak input level expected. For amplifiers presented with an input signal having a wide dynamic range, the input signal infrequently achieves peak levels and frequently operates below peak levels. As such, the amplifier may exhibit low overall efficiency.

A solution to the problem of low amplifier efficiency is to vary one or more of the above-stated characteristics (geometry, load, supply voltage) in response to the input signal. Techniques to vary one or more of these characteristics are known in the art.

Techniques that vary the device geometry and load tend to be very dependent on the particular power amplifier topology used, and generally present challenging RF problems. Repeatability of such designs in production is generally a problem.

Various techniques are known in the art for enhancing amplifier efficiency based on the supply voltage. Of supply voltage based efficiency enhancement schemes, there are two broad classifications of solution. These solutions are:

(i) envelope elimination and restoration, and
  (ii) envelope tracking.

Envelope elimination and restoration requires the amplifier to be driven saturated, and all the envelope information to be applied through the amplifier supply. This technique tends to be generally too demanding upon the supply modulator when using high modulation bandwidths, and thus has limited usefulness in practical applications.

With envelope tracking, the amplifier is driven in a substantially linear fashion. Envelope tracking requires an efficient power supply capable of delivering high modulation power bandwidths. In known techniques, a switched mode pulse width modulator (commonly referred to as class S) is used to realise an efficient variable supply to the power amplifier. However, in order to operate at full bandwidth, the supply must switch at many times the bandwidth of the modulation, and this excessively high switching speed results in poor modulator efficiency.

In another prior art envelope tracking technique, a plurality of highly efficient intermediate power supplies are provided, and the power supplies are switched as required by the envelope level. This switching creates transient disturbances that degrade the spectrum with high order intermodulation products, and makes linearization difficult by introducing supply dependent non-linearities alongside input dependent non-linearities.

In a further modification to this technique, the switching of the power supplies is combined with a linear amplifier to provide a smooth transition between switch levels and remove the supply dependent linearization requirement. The aim of this form of envelope tracking is to provide a unique value of supply voltage for every envelope level. However, there is a problem in achieving this without impact upon tracking speed capability.

It is an aim of the present invention to provide an improved supply voltage based efficiency enhancement scheme, which preferably addresses one or more of the above-stated problems.

SUMMARY OF THE INVENTION

According to the present invention there is provide a power supply stage, comprising: reference means for providing a reference signal representing a desired power supply voltage; election means for selecting one of a plurality of power supply voltages in dependence on the reference signal; adjusting means for receiving the selected power supply voltage and the reference signal and adapted to generate an adjusted selected power supply voltage tracking the reference signal in dependence thereon.

The power supply stage may be for an amplifier, the reference signal representing the envelope of an input signal of said amplifier.

The adjusting means may include an AC amplifier. The selected power supply voltage may have the minimum absolute difference between said power supply voltage and the reference signal level.

The ac amplifier may be connected to amplify the difference between the reference signal and a representation of the selected power supply voltage. The adjusting means may include means for summing the amplified difference with the selected supply voltage.

The representation of the selected power supply voltage may be the power supply voltage itself. The representation of the selected power supply voltage may be the adjusted selected power supply voltage. The adjusted selected supply voltage may be the output of the power supply stage.

The adjusting means may further include a high frequency amplifier. The high frequency amplifier may be connected to amplify the difference between the reference signal and a representation of the adjusted power supply voltage. The adjusting means may include means for summing the amplified difference with the adjusted supply voltage to generate a further adjusted supply voltage. The representation of the adjusted supply voltage may be the adjusted supply voltage itself. The representation of the adjusted supply voltage may be the further adjusted supply voltage. The further adjusted supply voltage may form the output of the power supply stage.

There may further be provided an interpolation means at the input to the adjusting means such that the selected power supply voltage is interpolated. The interpolation means comprises an inductor-capacitor arrangement.

There may further be provided means for DC clamping the AC amplifier. The means for DC clamping may be responsive to detection of the reference signal being less than the adjusted supply voltage.

There may be provided a delay element for delaying the reference signal. There may further be provided slow DC adjustment means for removing a DC component from the AC amplifier.

The adjusting means may comprise a plurality of cascaded correction circuits. The adjusting means may comprise two or more cascaded correction circuits.

There may be provided a delay element for compensating for differences in delays between the signal amplifier and power supply control input.

In a further aspect the present invention provides a radio frequency amplification stage comprising: an amplifier for receiving an input signal to be amplified and a power supply voltage; and a power supply voltage stage for supplying said power supply voltage, comprising: means for providing a reference signal representing the envelope of the input signal; means for selecting one of a plurality of supply voltage levels in dependence on the reference signal; and means for generating an adjusted selected power supply voltage, comprising an AC amplifier for amplifying a difference between the reference signal and one of the selected supply voltage level or the adjusted selected supply voltage level, and a summer for summing the amplified difference with the selected supply voltage to thereby generate the adjusted supply voltage.

The means for generating an adjusted selected supply voltage may further generate a further adjusted supply voltage and further comprises an RF amplifier for amplifying a difference between the reference signal and one of the adjusted supply voltage or the further adjusted supply voltage, and a summer for summing such amplified difference with the adjusted supply voltage to thereby generate the further adjusted supply voltage.

One of the adjusted supply voltage or further adjusted supply voltage may form the supply voltage to the amplifier.

In a still further aspect the present invention provides a method of controlling a power supply stage, comprising: providing a reference signal representing a desired power supply voltage; selecting one of a plurality of power supply voltages in dependence on the reference signal; generating an adjusted selected power supply voltage tracking the reference signal in dependence on the selected power supply voltage and the reference signal.

The reference signal may represent the envelope of an input signal to an amplifier, the power supply stage providing a power supply to said amplifier. The difference between the reference signal and a representation of the selected power supply voltage may be AC amplified. The amplified difference may be summed with the selected supply voltage to form the adjusted supply voltage. The difference between the reference signal and a representation of the adjusted power supply voltage may be RF amplified.

The amplified difference may be summed with the adjusted supply voltage to form a further adjusted supply voltage. The method may further comprise an interpolating step prior to said step of generating an adjusted supply voltage The method may further comprise an AC amplification step.

The present invention provides a controlled voltage source for maintaining a supply current, connected in series with the supply voltage source, such that the same current flows through both voltage sources.

BRIEF DESCRIPTION OF THE DRAWINGS

The present invention in now described by way of example with reference to the accompanying Figures, in which:

FIG. 1 illustrates a block diagram of an RF amplification stage embodying the concept of the present invention;

FIG. 2(a) illustrates the concept of envelope tracking supply voltage variation, and the problems associated therewith;

DESCRIPTION OF PREFERRED EMBODIMENTS

Figure 2B:
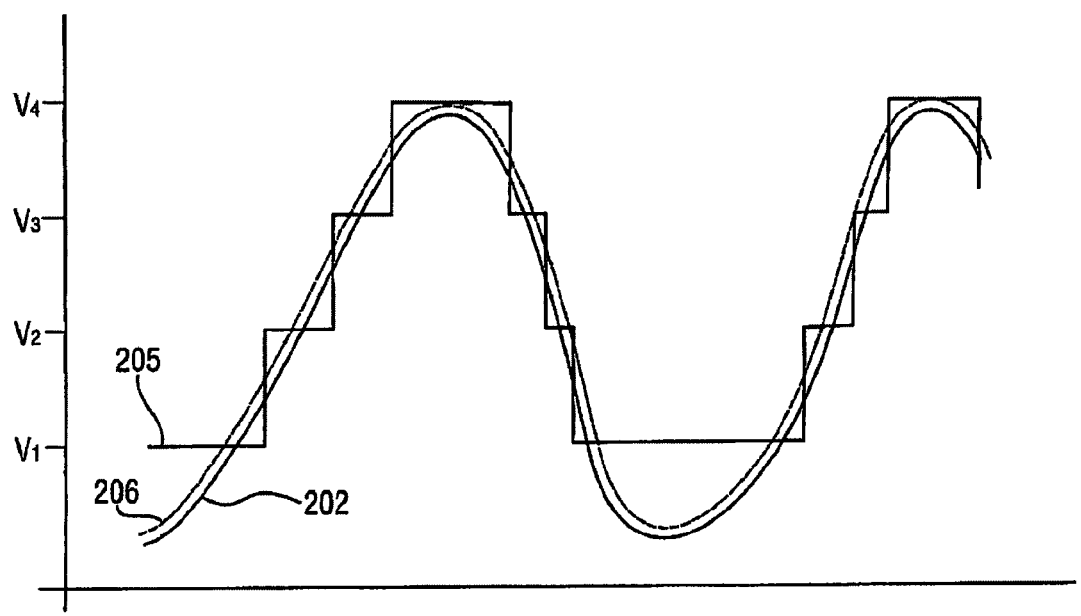
FIG. 2(b) illustrates the principle of the improvements offered by the present invention.

The present invention is described herein by way of particular examples and specifically with reference to a preferred embodiment. It will be understood by one skilled in the art that the invention is not limited to the details of the specific embodiments given herein. In particular the invention is described herein by way of reference to an RF amplification stage. However more generally the invention may apply to any arrangement where it is necessary to switch between a plurality of voltage supplies.

Referring to FIG. 1, there is illustrated an RF amplification stage 100 in accordance with the general principles of the present invention. The RF amplification stage 100 includes an RF amplifier 102, a supply voltage selection block 106, an envelope detector 104, and a supply voltage adjustment block 108.

The supply voltage selection block 106 receives four supply voltages $V_1$-$V_4$ on respective input lines $132_1$-$132_4$. The selected supply voltage is output from the supply voltage selection block 106 on line 120. The RF amplification stage 100 receives an RF input signal $RF_{IN}$ on line 110. The envelope detector 104 has an input 114 coupled to line 110 to thereby detect the RF input signal. The envelope detector provides an output on line 118 to the supply voltage selection block 106 to provide the necessary information for the supply voltage selection to take place. In addition, and in accordance with the present invention, the envelope detector 104 provides a second output on line 116 to the supply voltage adjustment block 108. Supply voltage adjustment block 108 additionally receives the output of the supply voltage selection block on line 120. The supply voltage adjustment block 108 generates an adjusted supply voltage on line 122 for the RF amplifier 102. The adjusted supply voltage on line 122 preferably forms a feedback input to the supply voltage adjustment block 108. As discussed hereinbelow a feedback arrangement is preferable in embodiments of the invention, although feedforward arrangements may also be used.

As discussed in further detail hereinbelow, the supply voltage adjustment block 108 operates in accordance with the principles of the preferred embodiment of the present invention to adjust the supply voltage signal on line 122, in dependence upon the signal on line 116 and the feedback adjusted supply voltage on line 122, to provide adjusted supply voltage $V_S$ on line 122 to the RF power amplifier 102. The RF power amplifier receives as its signal input the RF input signal on line 110. The RF amplifier 102 provides on line 112 the RF output signal $RF_{OUT}$.

The operation of the RF amplification stage 100 in accordance with the present invention will be described further hereinbelow. However reference is first made to FIG. 2(a), which illustrates the concept of envelope tracking supply voltage, and the problems associated therewith. Referring to FIG. 2(a), there is illustrated a plot of voltage against time. On the voltage axis, there is illustrated four specific voltage levels $V_1$-$V_4$ corresponding to the voltage levels provided to the supply voltage selection block 106 of the RF amplification stage of FIG. 1. It should be noted that the provision of four voltage supplies is illustrative, and the RF amplification stage may in fact be provided with more or less voltage supplies in accordance with implementation requirements.

Curve 202 of FIG. 2(a) illustrates the voltage envelope of the RF input signal to the RF amplification stage, i.e. the signal on line 110. The dash line curve 206 illustrates the idealized voltage supply envelope for such an RF input signal. As can be seen, the dash line curve 206 tracks the RF input signal envelope 202 to provide an ideal power supply for the current input signal level. As such, the idealized power supply voltage avoids any wasted power and consequently is very efficient.

The stepped curve 204 illustrates a typical voltage supply to an RF power amplifier based on a switch supply voltage of four levels, reflecting performance typical in prior art implementations. As the envelope 202 of the RF input signal reaches the voltage levels $V_1$-$V_4$, the supply voltage is appropriately switched. As can therefore be seen from FIG. 2(a), the supply voltage 204 steps between the four supply voltage levels. As such, the supply voltage level to the RF amplifier is frequently excessive. As illustrated by the hatched area 208, the stepped supply voltage implementation of the prior art is generally significantly less efficient than the idealized solution. The hatched area 208 in FIG. 2(a) represents wasted energy, corresponding to supply voltage levels above the idealized level and which is consequently unnecessary. Referring to FIG. 2(b), there is illustrated the efficiency improvement achieved in accordance with the present invention. The stepped curve 205 illustrates the voltage supply generated by the switched supply voltages. The supply voltage 205 provided by the supply voltage selection block, as discussed hereinbelow, tracks above and below the envelope 202. Such a function is provided, in the preferred embodiment, due the use of an AC amplifier in the supply voltage adjustment block 108. The embodiments of the present invention result in an actual supply voltage to the amplifier which more closely follows the idealized supply voltage 206, resulting in improved efficiency and a final voltage to the amplifier which is more closely aligned to the idealized voltage 206. As will be discussed hereinbelow, in an embodiment the supply voltage selection block may provide at its output a step function equivalent to function 204 in FIG. 2(a). IN such an arrangement a DC offset is provided between at the output of the supply voltage selection block to provide a function equivalent to function 205 of FIG. 2(a).

The RF amplification stage of FIG. 1, in accordance with the present invention and embodiments described further hereinbelow, provides an improved solution in which the switched supply voltage more closely tracks the idealized supply voltage envelope, as shown in FIG. 2(b), and minimizes wasted energy and thereby maximizes efficiency.

The RF amplification stage 100 in accordance with the present invention comprises an RF amplifier 102 that may be connected to one of a number of efficiently generated DC power supplies ($V_1$-$V_4$) through the supply voltage selection block 106 and the supply voltage adjustment block 108. The function of the supply voltage selection block 106 and supply voltage adjustment block 108 is to approximately follow, as closely as possible, the envelope of the input signal without incurring additional energy dissipation, as represented by hatched area 208 in FIG. 2(a).

In general, given a selection of the desired supply voltage for the RF input signal to be amplified, the supply voltage selection block 106 connects the selected supply voltage to its output on line 120. The supply voltage adjustment block 108 functions to apply an appropriately adjusted version of the supply voltage on line 120 to the RF amplifier 102 in such a way as to approximate envelope tracking at the amplifier supply, but without introducing the reduced bandwidth or reduced efficiency associated with linear devices providing the full range of RF amplifier supply voltages. This configuration allows the amplifier to achieve high efficiency at high modulation bandwidths.

Figure 3:
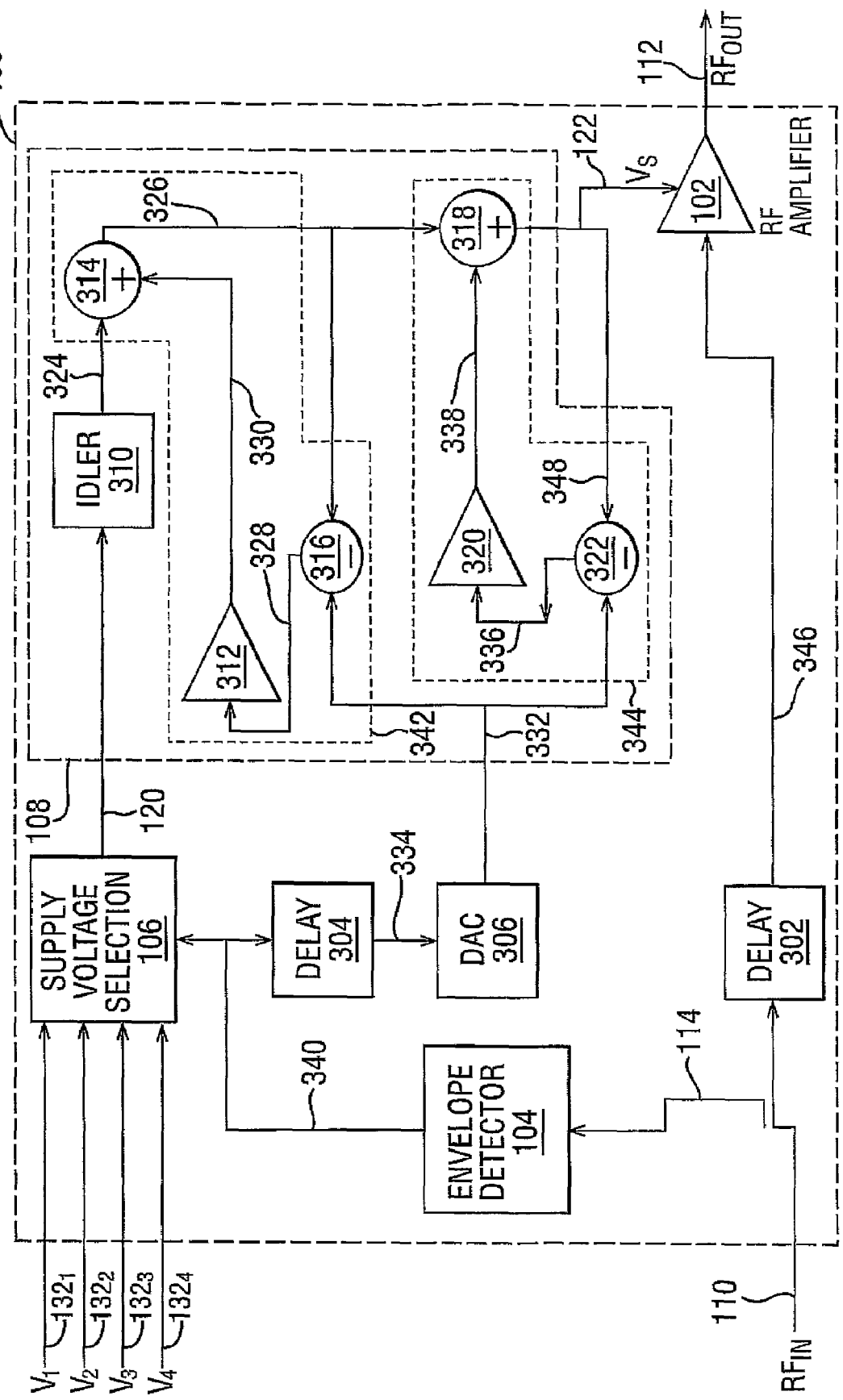
FIG. 3 illustrates in more detail an implementation of the RF amplification stage of FIG. 1 including a correction path in accordance with the present invention.

Referring to FIG. 3, there is shown a preferred implementation of the RF amplification stage 100 of FIG. 1 in accordance with the preferred embodiment of the present invention. Where elements of the RF amplification stage 100 correspond to elements shown in FIG. 1 the same reference numeral is used.

As in FIG. 1, the RF amplification stage 100 includes the envelope detector 104, the supply voltage selection block 106, the RF amplifier 102, and the supply voltage adjustment block 108. In FIG. 1, the envelope detector 104 is illustrated providing two distinct outputs on lines 118 and 116. In the embodiment of FIG. 3, the envelope detector 104 provides a single output on line 340, which provides the input to the supply voltage selection block 106 and an input to a delay element 304. The output of delay element 304 on line 334 forms an input to a digital-to-analogue converter (DAC) 306, which provides an output on line 332 forming an input to the supply voltage adjustment block 108 equivalent to the signal on line 116 in FIG. 1. The RF amplifier 102 is further provided with a delay element 302 at its input, such that the RF input signal on line 110 forms an input to the delay element 302, and the output of the delay element on line 346 forms the input to the RF amplifier 102. Note that in an actual implementation, delay 302 could alternatively be connected in the path between sample 114 and envelope detector 104 instead of before the RF amplifier. The delay element is preferably placed in the path (supply or RF amplifier) that has the smallest delay. The supply voltage adjustment block 108 generally includes an idler 310, a first feedback circuit 342 and a second feedback circuit 344. The idler 310 receives the output of the supply voltage selection block 106 on line 120. The idler 310 provides an output on line 324 forming a first input to a summer 314 of the first feedback circuit 342. The output of the summer 314 is provided on line 326, and forms the output of the first feedback circuit 342. The signal on line 326 additionally forms a first input to a subtractor 316. The second input of the subtractor 316 is provided by the output of the DAC 306 on line 332. The output of the subtractor 316 is provided on line 328 and forms an input to an AC amplifier 312, the output of which on line 330 forms the second input to the summer 314. The second feedback circuit 344 is constructed similarly to the first feedback circuit 342. The input to the second feedback circuit 344 is provided by the output of the first feedback circuit 342 on line 326, which forms a first input to a summer 318 of the second feedback circuit. The output of the summer 318 on line 348 forms a first input to a subtractor 322, the second input to which is formed by the output of the DAC 306 on line 332. The output of the subtractor 322 on line 336 forms an input to a HF amplifier 320, the output of which on line 338 forms the second input of the summer 318. The output of the summer 318 on line 348 also forms the supply voltage input $V_S$ on line 122 to the RF amplifier 102.

In general, therefore, each feedback circuit receives an input voltage and outputs an adjusted version of said voltage. The adjustment is performed in dependence on the output of the feedback circuit (defining the feedback path) and a reference signal which in the described embodiment is formed by the output of the envelope detector 104.

The supply voltage adjustment block 108 operates to provide an adjusted voltage level to the RF amplifier 102 which tracks the voltage level of the envelope representing the input to the RF amplifier, but which has a large output current corresponding to the large output current provided by the output of the supply voltage selection block 106.

The general principle of operation of the RF amplification stage 100 of FIG. 3 is now described. The envelope detector 104 and supply voltage selection 106 provides a minimized loss predictive feed forward path that approximates the required voltage supply tracking waveform. The envelope detector 104 provides on its output line 340 the detected envelope of the RF input signal on line 110, which information is provided to the voltage supply selection block 106.

The supply voltage selection block 106, which is preferably implemented as a splicer network, is connected to a plurality, in the embodiment four, of fixed high efficiency DC power supplies. The splicer network is preferably a network of transistors and diodes specifically designed to connect a selected supply voltage to the output on line 120 with a minimum of switching transients. The supply voltage selection 106 preferably operates on the output of the envelope detector 104 to switch between the voltage supplies at its input as the voltage level indicated by the envelope detector 104 of the RF input signal rises and falls above and below threshold voltage levels corresponding to the respective supply voltages. In this way, the supply voltage selection block 106 provides on its output 120 an appropriate one of the supply voltages $V_1$-$V_4$.

The implementation of the supply voltage selection block to provide a voltage function 205 as illustrated in FIG. 2(b) is within the scope of one skilled in the art. In a preferred implementation a DSP provides digital signals in a 'thermometer code' format (i.e. 0000, 0001, 0011, 0111, 1111). The splicer network is preferably an arrangement of diodes and transistors that respond to this digitally coded signal by switching to the highest voltage level representing a level '1' logic signal. All lower level switches are turned off by means of the circuit function implemented within the splicer network, and without intervention from a DSP.

As discussed above, in an alternative arrangement the supply voltage selections block 106 may output a function such as function 204 in FIG. 2(a), and a dc offset circuit may be provided at its output. The need to have a function such as function 205 in FIG. 2(b) will become apparent in the following description.

The purpose of the delay block 304 at the input to the DAC 306 is described further hereinbelow. Generally the delay block ensures the timing of signals in the amplification stage is synchronized.

The DAC 306 is provided on the basis that the RF input signal is a digital signal. However, the present invention is not limited in its use to digital applications. The DAC 306 converts the envelope detector output on line 340 provided via the delay element 304 into an analogue format for input on line 332 to the supply voltage adjustment block 108.

The idler 310, and the first and second feedback circuits 342 and 344, operate on the selected supply voltage on line 120 to provide an improved and efficient voltage supply signal on line 122 to the RF amplifier.

The idler 310 provides interpolation of the signal at its input on line 120 to generate an output on line 324. The idler 310 is preferably a circuit consisting of low-loss energy storage elements, and acts to redistribute energy supplied via the splicer network of the supply voltage selection block 106 in an optimal fashion to improve amplifier efficiency and reduce unwanted emissions.

The first feedback circuit 342 is a corrective AC feedback circuit or correction circuit and functions to provide fine correction to the output of the predictive feedforward path on line 324. The AC feedback circuit 342 increases efficiency The second feedback circuit is a low power high frequency corrective circuit which removes any residual high frequency glitches from the output of the first feedback circuit.

It should be noted that although the preferred embodiment of FIG. 3 illustrates two feedback circuits connected in a cascade arrangement, the invention is not limited to such an arrangement. A single feedback circuit or any number greater than two may be provided may be provided. Where a single feedback circuit is provided, it is preferably an AC feedback circuit. It should also be noted that the idler 310 is not essential to the present invention, and is used in preferred embodiments. Further, the supply voltage adjustment block may be implemented by using feedforward circuit(s) in some or all of the corrective blocks in the cascade.

In general the supply voltage selection block 106 and the envelope detector 104, can be considered to form a minimal loss predictive feedforward path, which provides an approximation of the required tracking waveform for the supply voltage to the RF amplifier. When used, the output of the idler 310 forms the output of the feedforward path.

In general, in the preferred embodiment the supply voltage adjustment block 108 comprises a corrective feedback path. Of course, where provided, the idler 310 does not form part of such path. The supply voltage adjustment block 108 may comprise a plurality of corrective feedback paths. Where a plurality of corrective feedback paths are provided, they are preferably provided in cascade. As discussed further hereinbelow, in embodiments preferably clamping and DC restoration means are provided in the supply voltage adjustment block 108 in order to overcome any limitations of AC feedback and DC tracking.

The delay block 304 is preferably provided in order to remove any differential time delay between the predictive and corrective parts of the RF amplification stage 100. The delay element 302 is inserted in the RF input signal path for the purpose of compensating for the delay of the amplification stage 100.

The operation of the supply voltage adjustment block 108 is now further described. The DAC 306 effectively provides on line 332 a reference signal for use by the supply voltage adjustment block 108. The signal on line 332 represents the envelope of the RF input signal detected by the envelope detector 104, and therefore it represents a reference level for the supply voltage which should be supplied to the RF amplifier 102 at any instant in order to achieve maximum efficiency. This envelope corresponds to the envelope 202 of FIG. 2(b) above.

The signal provided by the supply voltage selection block 106 on line 120 corresponds to the step function 205 of FIG.

2(b) above. In accordance with the preferred embodiment of the present invention the power supply voltage selection block rounds to the nearest supply voltage level, as shown in FIG. 2(b), whereas the prior art always truncates upwards as shown by curve 204 in FIG. 2(a). The purpose of the RF amplification stage 100 is to adapt the step function on line 120 in dependence upon the reference signal on line 332 in order to provide a signal at the supply voltage input to the RF amplifier which closely approximates the idealized supply voltage indicated by dash line 206 of FIG. 2(b).

As discussed above, the idler 310 is not essential to the implementation of the present invention. The idler is preferably a reactive LC (inductor-capacitor) combination, provided on the output of the supply voltage selection block 106 in order to improve efficiency. The addition of the idler, which can store energy from the supply voltage selection block and release it as required by the amplifier, improves the efficiency of the RF amplification stage in achieving a closer match of the amplifier's optimal power supply requirements. The idler circuit therefore assists in improving efficiency for rapidly changing waveforms and for reducing unwanted emissions.

The use of the idler is advantageous, in smoothing the output of the supply voltage selection block. It should be noted, however, that forming a feedback loop from the output of the idler to the supply voltage selection block in attempt to provide correction equivalent to the supply voltage adjustment block 108 would not provide a practical solution. Whilst the idler advantageously smoothes out output of the supply voltage selection block, as its name suggests it does so at the expense of speed. The idler is too slow to be incorporated in a corrective feedback loop, and a practical correction circuit could not be achieved in this way.

The provision of a feedback loop in the supply voltage adjustment block, in accordance with the preferred embodiment of the invention, allows for a fast corrective loop with a wide bandwidth. Similar advantages are obtained for the feedforward case.

The AC corrective amplifier 312 of the first feedback circuit 342 requires an AC signal at its input. This is achieved by the supply voltage selection block rounding to the nearest supply voltage level rather than truncated to the highest level; such a step function is necessary for the AC correction to work. As can be seen from FIG. 2(b), the input to the AC amplifier 312 is the difference between the supply voltage signal and the reference signal. This can only be an AC signal if the supply voltage signal alternates above and below the reference signal, thus producing a usable input for the amplifier 312.

The process of rounding the power supplies in the voltage selection block 106, rather than truncating them as in the prior art, is equivalent to doubling the effective number of power supplies compared to a prior art system.

This doubling is effectively achieved by halving the error relative to the prior art. So for the same number of power supplies provided, with the invention the error is halved such that there are in effect twice as many power supplies as in the prior art. Alternatively, the invention may be considered to offer the same error as a prior art system with only half the number of supplies needed.

The subtractor 316 of the first feedback circuit receives, in effect, the current output of the supply voltage selection block 106, and the envelope reference signal on line 332. The output of the subtractor 316 on line 328 is thus the difference between the two signals, representing the error in the signal at the output of the supply voltage selection block compared to the ideal voltage supply 332. The amplified error signal on line 330 is then added to the output of the supply voltage selection block 106, in order to provide a supply voltage signal on line 326 which is compensated for the error. The AC amplifier 312 has to handle error signals with a high peak to mean ratio, and is thus preferably implemented as a class G amplifier with multiple switch supplies for optimum efficiencies. The amplifier 312 handles much lower power levels than the supply voltage selection block 106, and therefore can be implemented with smaller, faster devices.

The second feedback circuit 344 provides for additional correction means. Further correction means may be added as required, and furthermore only one correction means may be required. The corrective circuits of the supply voltage adjustment block 108 effectively force the supply voltage of the RF amplifier to closely track the reference provided by the envelope detector 104 over a wide range of frequencies.

The summation means 314 and 318 may preferably be implemented as transformers.

The supply voltage selection block 106, preferably comprising a splicer including a switch matrix, is preferably controlled by a digital signaling processing means, which digital signaling processing means may further include the delay elements 302 and 304, the DAC 306 and the envelope detector 104. The specific implementation of such digital signaling processing means, including the various associated elements, will be within the scope of a person skilled in the art.

Implementing the AC amplifier 312 of the first feedback circuit 342 with a plurality of switched voltage supplies advantageously means that the number of supply voltages to the RF amplifier 102 may be significantly increased. For example, if the AC amplifier 312 was associated with m supply voltages, and the main supply voltage selection is associated with n supply voltages, the total number of supply voltages available to the RF amplifier 102 is m*n. As discussed above, the use of power supply rounding in the supply voltage selection block effectively doubles the number of power supplies, such that the total number of power supplied may become 2*m*n.

Such an embodiment of the present invention offers significant advantages. As discussed above, the small size of the amplifier 312 means that it is not associated with the problems associated with the supply voltage selection block 106, which problems the invention is intended to overcome. The envelope tracking feedback loop of the supply voltage adjustment block 108 does not require any large geometry devices, or the high current large geometry devices being providing at the predictive feedforward path rather than the feedback loop. As such, there is provided a large increase in the power bandwidth of the envelope tracking loop.

Figure 4:
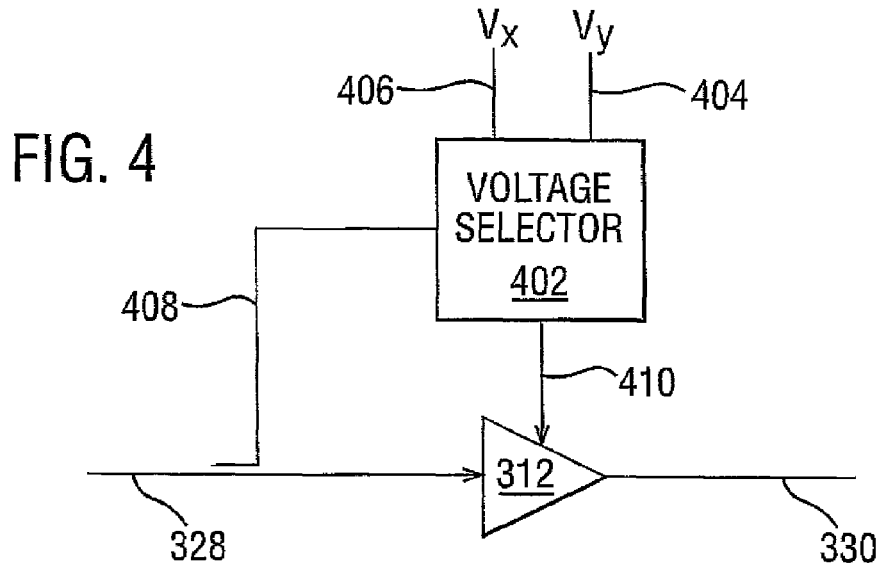
FIG. 4 illustrates an enhanced exemplary implementation of the correction path of FIG. 1.

Referring to FIG. 4, there is illustrated the adaptation of the amplifier 312 in order to provide a variable supply voltage to said amplifier. The provision of such variable supply to the amplifier may be in accordance with techniques known in the art. As shown in FIG. 4, there is provided a voltage selector 402, which receives an input of a line 408 coupled to the signal input of the amplifier. The input on line 408 represents the amplitude of the input signal. The voltage selector 402 also receives a plurality of supply voltages, e.g. two supply voltages Vx and Vy on lines 406 and 404. The voltage selector 402 selects one of the supply voltages for output on line 410 as the supply voltage for the amplifier. The supply voltage Vx and Vy is selected in dependence on the envelope on line 408.

The implementation of the amplifier 312 with selectable power supplies is not limited to such an arrangement. The implementation may be achieved, for example, under the control of a DSP.

As discussed further hereinbelow, in a preferred embodiment the use of clamping and restoration means removes the need for any DC corrective feedback.

Further discussion of detailed, preferable aspects of implementations of the present invention are discussed hereinbelow. Firstly, the implementation of an embodiment of the present invention utilizing a feedforward corrective circuit is discussed.

Figure 5A:
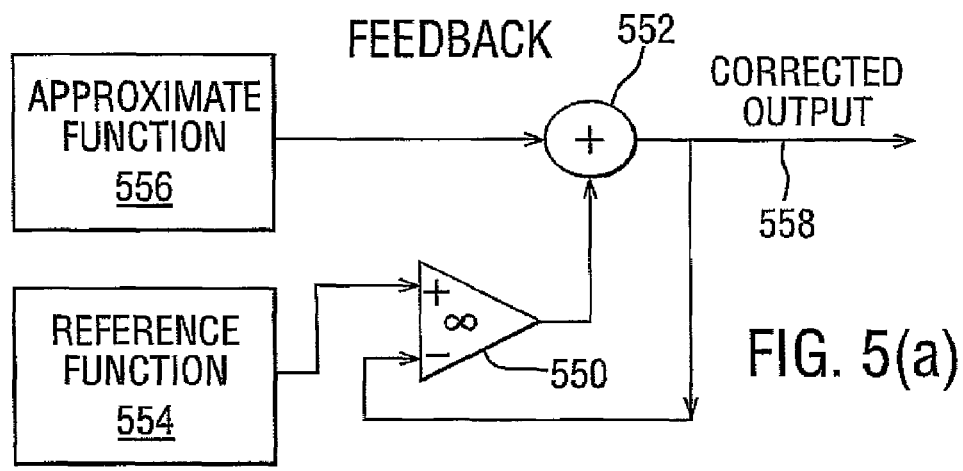
FIGS. 5(a) and 5(b) illustrate alternative implementations of the correction path in embodiments of the present invention.
Figure 5B:
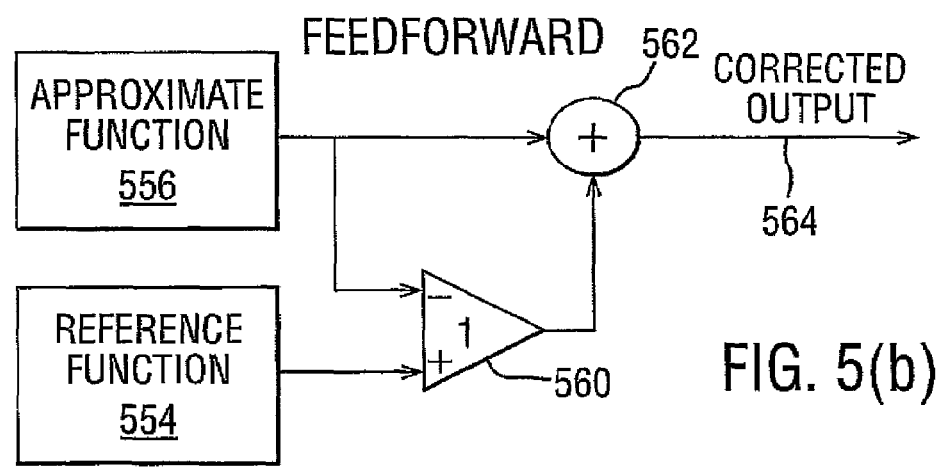

In the embodiments of FIGS. 1 and 3, the corrective circuit or corrective path in the supply voltage adjustment block is implemented as a feedback arrangement. The general principle of such an arrangement is shown in FIG. 5(a). Generally an approximate function block 556 generates a signal to be corrected, and a reference function block 554 generates a reference signal. The signal to be corrected forms a first input to a summer 552, the output of which on line 558 represents the corrected signal. The reference signal and the corrected signal form inputs to an amplifier 550, the output of which forms a second input to the summer 552. It should be noted that this is the general principle of the feedback paths of FIG. 3, the input to the amplifier 312 being provided by a subtractor which receives the corrected output and the reference signal as inputs. Referring to FIG. 5(b), there is illustrated the principle, in an alternative embodiment, of a feedforward arrangement. The signal to be corrected again forms a first input to the summer 562. An amplifier 560 receives as inputs the signal to be corrected and the reference signal. The amplifier output forms the second input to the summer 562, the output of which again forms the corrected output. A feedforward arrangement as shown in FIG. 5(b) may be used in the embodiments of FIGS. 1 and 3 in place of a feedback arrangement.

As the splicer network of the supply voltage selection block is implemented as part of a predictive feedforward controller, adaptive control of the splicer parameters improves efficiency. A local version of the splicer output is therefore preferably generated digitally from models of the elements in the splicer network. The decision to change the splicer level, i.e. the output supply voltage, is made in order to minimize the difference between the locally generated splicer waveform (including consideration of past, present and future values) and the envelope representation. Included in this model are:

a) switch delay and risetime parameters;
b) filter parameters; and
c) splicer voltages and FET resistances.

The locally generated parameters are related to the actual parameters by comparing locally generated measured parameters with those obtained from the actual circuit. The actual parameters that are most convenient to measure is the signal error from comparison of the splicer output and the averaged current consumption of the AC error amplifier 312 of the first feedback circuit 342. An optimization algorithm may be provided which aims to minimize the current consumption of the AC amplifier 312 by adjustment of the above measured parameters in the model. Convergence of the optimization will be assisted by consideration of the signed error of the splicer network to provide localized error correction. Selection of the supply to which the amplifier will be connected is made by a supply selection circuit.

The splicer circuit of the supply voltage selection block 106 consists of a network of switching transistors that are switched by logic signals originating in the digital signal processing (DSP) means. The implementation of such adaptive control will be understood by one skilled in the art.

Figure 6:
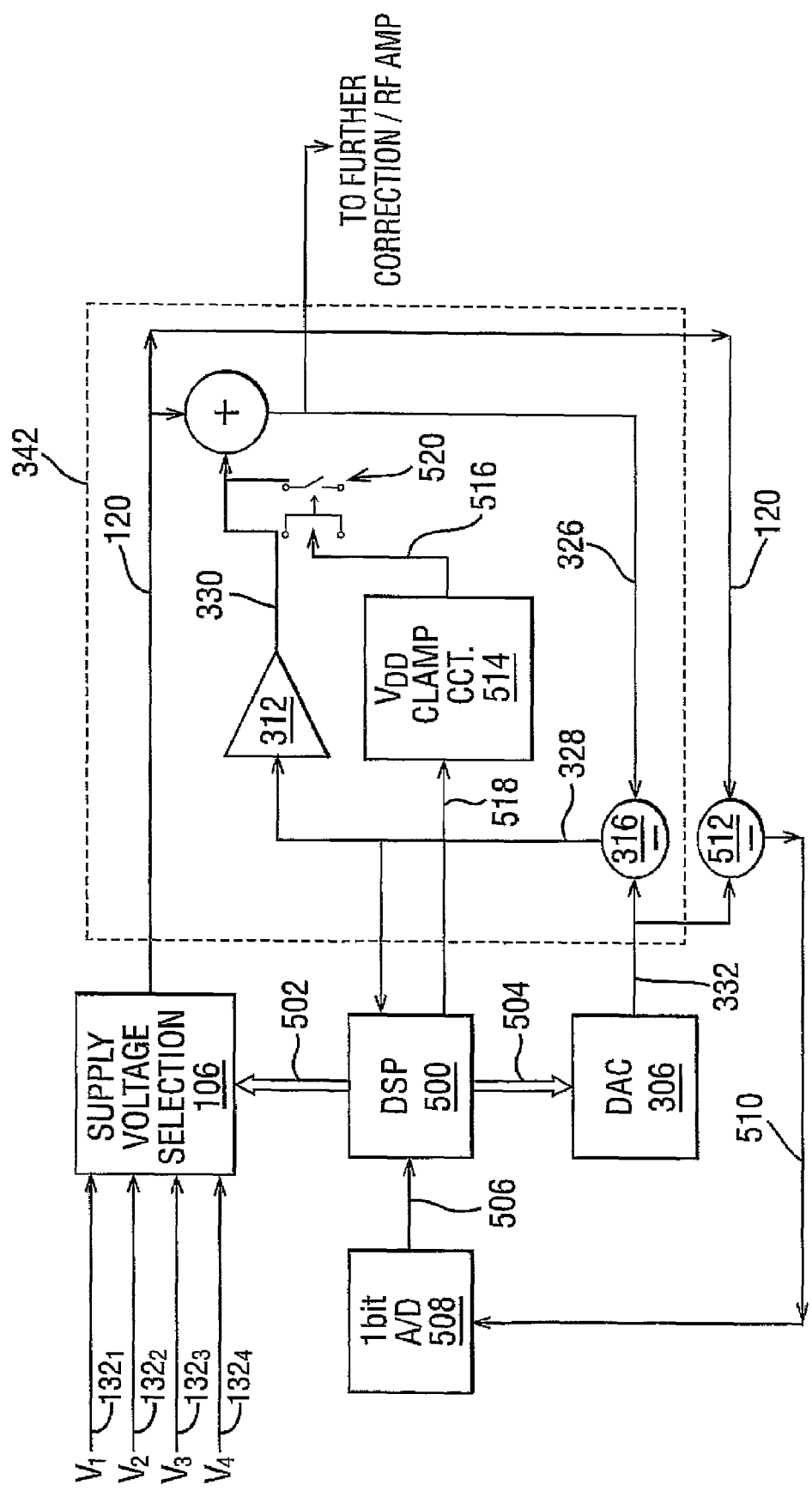
FIG. 6 illustrates an exemplary implementation of the DC control loops of the RF amplification stage of FIG. 1.

Referring to FIG. 6, there is illustrated the implementation of DC clamping and dc offset restoration in accordance with a preferred embodiment of the invention. DC clamping is provided to prevent accumulation of a DC error signal. DC offset restoration compensates for any adjustment in the actual supply voltage level. For example, although the selected supply voltage is 7V, it may actually be only 6.5V due to circuit degradations. DC offset restoration and DC clamping may be provided together, as described in this embodiment, or separately.

As before, elements in FIG. 6 corresponding to elements in earlier figures are identified by the same reference numerals. FIG. 6 illustrates only a portion of the RF amplification stage 100. FIG. 6 illustrates the supply voltage selection block 106, and the first feedback circuit or correction circuit 342 as illustrated in FIG. 3. Also shown is the DAC 306 of FIG. 3. In FIG. 6, the DAC 306 is shown to receive an input on lines 504 from a DSP 500. The DSP 500 also provides control inputs on lines 502 to the supply voltage selection block 106. As discussed hereinabove, in such an embodiment the DSP 500 may be considered to include the envelope detector 104 and delay element 304 of FIG. 3. As further shown in FIG. 6, the output of the first feedback circuit or correction circuit 342 on line 326 is provided to either a further cascaded feedback/correction circuit or directly to the supply voltage of the RF amplifier. In order to accommodate DC clamping, the RF amplification stage is further modified to include a subtractor 512, which receives as a first input the output on line 120 of the first feedback/correction circuit, and as a second input the reference signal on line 332 from the DAC 306. The output of the subtractor 512 is provided on line 510 to a single bit analogue-to-digital converter 508, which provides an output on line 506 to the DSP 500. The DSP 500 receives as an input the output of the subtractor 316, representing the error signal in the supply voltage signal. In addition the DSP 500 generates an output on line 518 which forms an input to a $V_{DD}$ clamp circuit 514. The output of the clamp circuit 514 on line 516 controls a clamp means, generally designated by reference numeral 520, connected to the output 330 of the AC amplifier 312.

Figure 7:
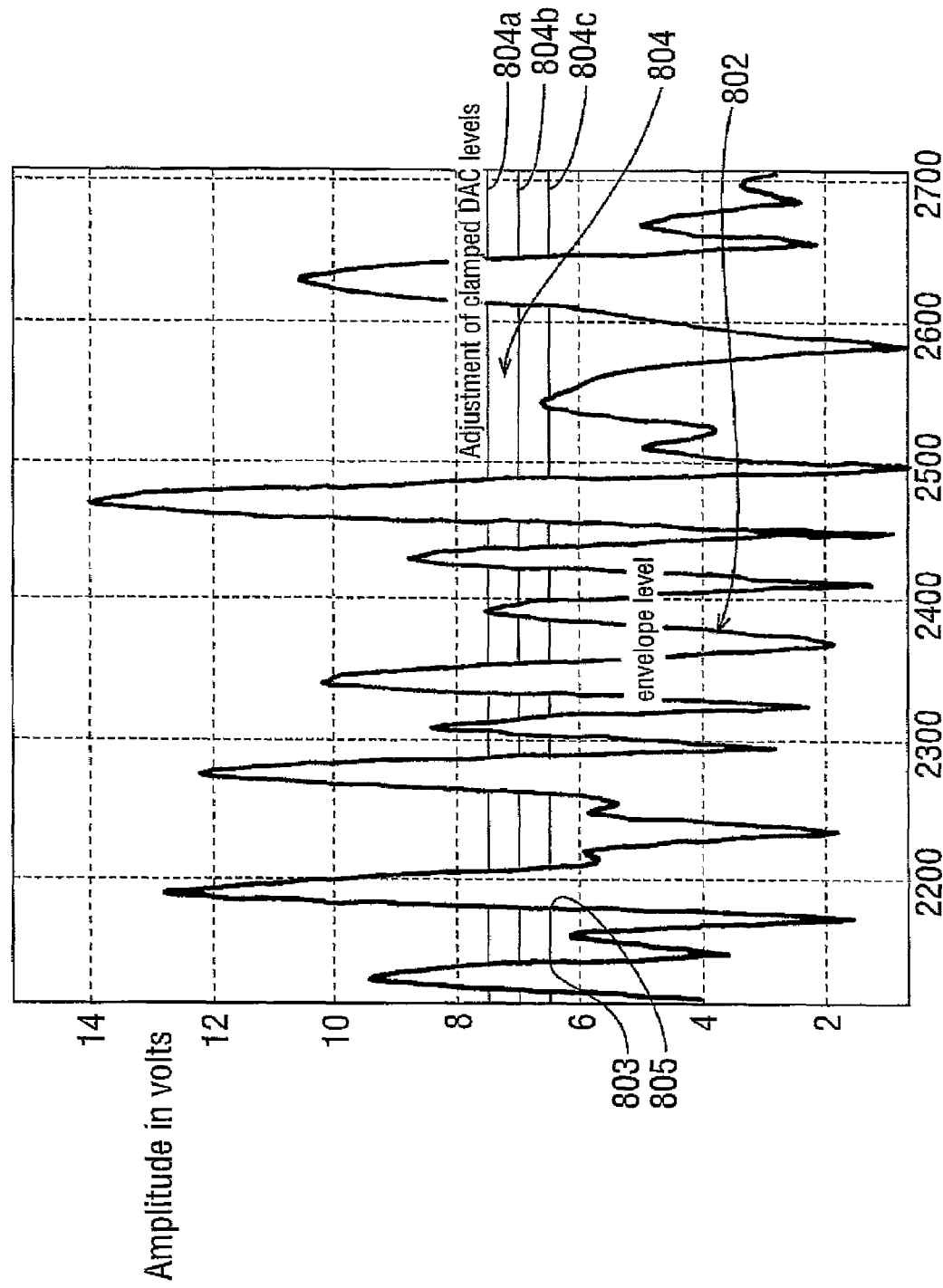
FIG. 7 illustrates a principle of operation in a preferred embodiment of the invention.

Referring to FIG. 7, it can be understood that the envelope signal goes below the lowest supply voltage level at certain points. For example, if it is assumed for the sake of example that line 804c represents a lowest supply voltage, between points 803 and 805 the envelope goes beneath the lowest supply voltage. During such time interval, there is no need for the supply voltage to the amplifier to be tracked by the correction circuit. The embodiments of the present invention therefore detect this condition, and use the existence of the condition to apply dc restoration as discussed further hereinbelow.

The subtractor 512 subtracts the reference signal on line 332 from the current supply voltage on line 120, and provides the difference to the 1 bit analogue to digital converter 508. The most significant bit identifies whether the current envelope level is above or below the lowest supply voltage fine control of envelope clamp off level being achieved by integration over time.

Responsive to the DSP detecting the appropriate condition, a command signal is sent to the $V_{DD}$ clamp circuit on line 518, which in turn controls the clamp means 50 to turn on. When turned on the clamp means 520 pulls the output of the ac amplifier on line 330 to a known reference level, preferably ground. The clamp means 520 is preferably a transistor.

The purpose of the DC clamping is to reset the amplifier 312 to a known state in order to avoid the build-up, over time, of a DC error. This is achieved as described above in a preferred embodiment. However other techniques may be provided for dc clamping. For example, the dc may be fed back, for example, by slow adjustment of the plurality of power supplies to the selection block 106 or use of a series pass transistor. Thus a certain time period is allocated as the DC clamping interval.

This comparison is necessary to allow for voltage drops in any components and conductors connected between the current supply voltage and the lower supply voltage during the clamp period. In any practical implementation, there will always be some uncertainty between the actual lower supply voltage level when delivering current to the RF amplifier and the level initially assumed by the clamped level at the envelope detector. The comparator 512 corrects for this and ensures that the envelope detector is clamped off at a level equal to the actual lower supply voltage.

The signal on line 506 is preferably gated in an integrator in the DSP 500. The output of the integrator sets the clamp level of the amplitude reference digital output on line 518. The effect is to alter the clamp level of the reference DAC 306. The integration thus compensates for variations in the supply voltage such that clamp-off occurs at the actual supply voltage (e.g. 6.5V) rather than the theoretical supply voltage (e.g. 7V). The integrator thus adjusts the clamping such that the clamp off voltage is equal to the value of the lowest supply input to 106 minus any additional voltage drops in 106.

During the clamping period, the value of the AC feedback output is set to zero by switches 520 that are turned on during the clamping period. This DC restoration enables an amplifier to be used with a finite lower cut-off frequency.

The error waveform has a flat frequency spectrum, which implies that the use of a bandpass AC amplifier, such as amplifier 312, may result in significant residual error due to the inability of the amplifier to follow low frequency components. By clamping the AC output during the clamping interval, and provided the low frequency time constant of the amplifier 312 is more than the interval between clamps, accurate tracking can be assured.

Referring to FIG. 7, the advantage achieved in the preferred embodiment utilizing DC clamping is illustrated. The curve 802 of FIG. 7 represents the envelope of the RF input signal. The straight lines 804*a*-804*b* illustrate the adjustment of the clamped DAC levels, i.e. the effect of dc removal.

Another significant source of low frequency error is any mismatch between the expected splicing voltages in the DSP 500 and the voltages existing at the output of the supply voltage selection block 106. This is equivalent to an error in the slicing threshold. A splicer adaptation algorithm, as described above, removes such errors in the thresholding.

Another DSP adjustment which may be preferably implemented is to delay the DAC envelope reference waveform output relative to the output of the supply voltage selection block 106, as represented by delay element 304 in FIG. 3 and discussed hereinabove.

Figure 8:
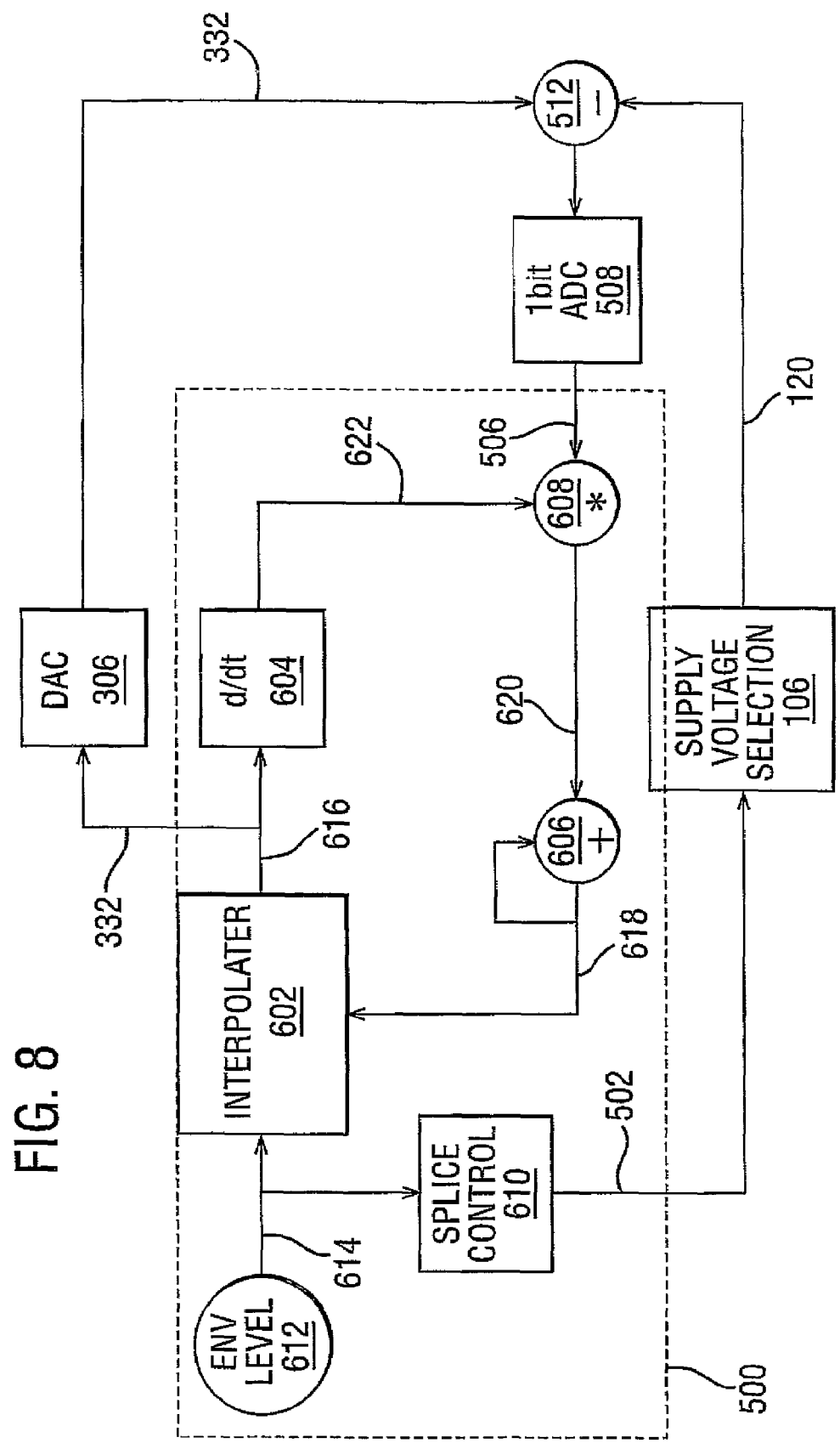
FIG. 8 illustrates an exemplary implementation of time delay elements of the RF amplification stage of FIG. 1.

An example delay balancing implementation is illustrated in FIG. 8, which includes the modifications introduced in FIG. 6 to provide for a clamping of a DC level in the feedback/correction circuit. The provision of the delay balancing implementation is preferable so as to affect maximum efficiency, since the AC amplifier 312 output is then minimized. An appropriate modification to the preferred embodiment of FIG. 6 is shown in the further preferred embodiment of FIG. 8. Only those elements necessary to understand this embodiment of the invention are illustrated.

Referring to FIG. 8, the digital signal processor 500 includes, in this preferred embodiment, an interpolator 602, a time differentiator 604, a multiplier 608, a summer 606, a splice control block 610, and an envelope level source 612. As will be understood, the envelope level source 612 represents the generation of the reference envelope, the preferable generation of which has been described hereinabove with reference to FIGS. 1 and 3.

In accordance with this embodiment of the invention, the elements of the DSP 500 shown in FIG. 8 function to provide delay balancing.

The envelope reference waveform generated by the envelope level block 612 on line 614 is provided to the interpolator 602, which provides an output on line 616 to the time differentiator 604. The output on line 616 also forms the input to the DAC 306 on line 332. The output of the time differentiator 604 on line 622 comprises the time derivative of the envelope reference waveform.

The time derivative of the envelope reference waveform on line 622 is multiplied in multiplier 608 with the single bit error signal on line 506 from the one-bit ADC 508. The multiplied result is presented on line 620 at the output of the multiplier 608.

The multiplied result on line 620 forms a first input to the summer 606, which is configured to function as an integrator. The output of the summer 606 on line 618 is fed back to form a second input to the summer. The integrated output on line 618 is provided as an input to the interpolator 602 to control or steer the delay of the reference waveform.

Sub-sample interval delay resolution can be achieved by interpolation of the reference waveform in the interpolator 602.

In summary, FIG. 8 shows a preferred implementation of the delay element 304 of FIG. 3, including the dc clamping control of FIG. 6. Other possible implementations of the delay element 304 will be within the scope of one skilled in the art.

The embodiments described hereinabove allow the RF amplification stage to operate without external adjustment for the majority of multi-carrier cases within power and bandwidth constraints. However there are two specific cases which may require the DSP 500 of FIG. 8 to automatically modify its operating mode. Some modification would be required to enable the envelope tracking to be accurate for constant envelope or slowly varying signals. An example of such a signal is GPRS (general packet radio services) in which only one carrier or two closely spaced carriers are required to be amplified. In such a scenario, the interval between successive clamps could be very long. This would require the DSP to evoke a time-out at which point second order delta sigma pulse width modulation between the nearest supplies is carried out by the splice control module 610. The use of pulse width modulation is acceptable in such a scenario because there is minimal high frequency envelope power present.

A further scenario arises when two carriers of an equal amplitude are present but separated by a large frequency interval, but the envelope depth is not sufficient to reach the minimum supply clamp. In this case, the clamping level is moved to the next highest supply level, and all other functions remain as in the multi-carrier case.

Figure 9:
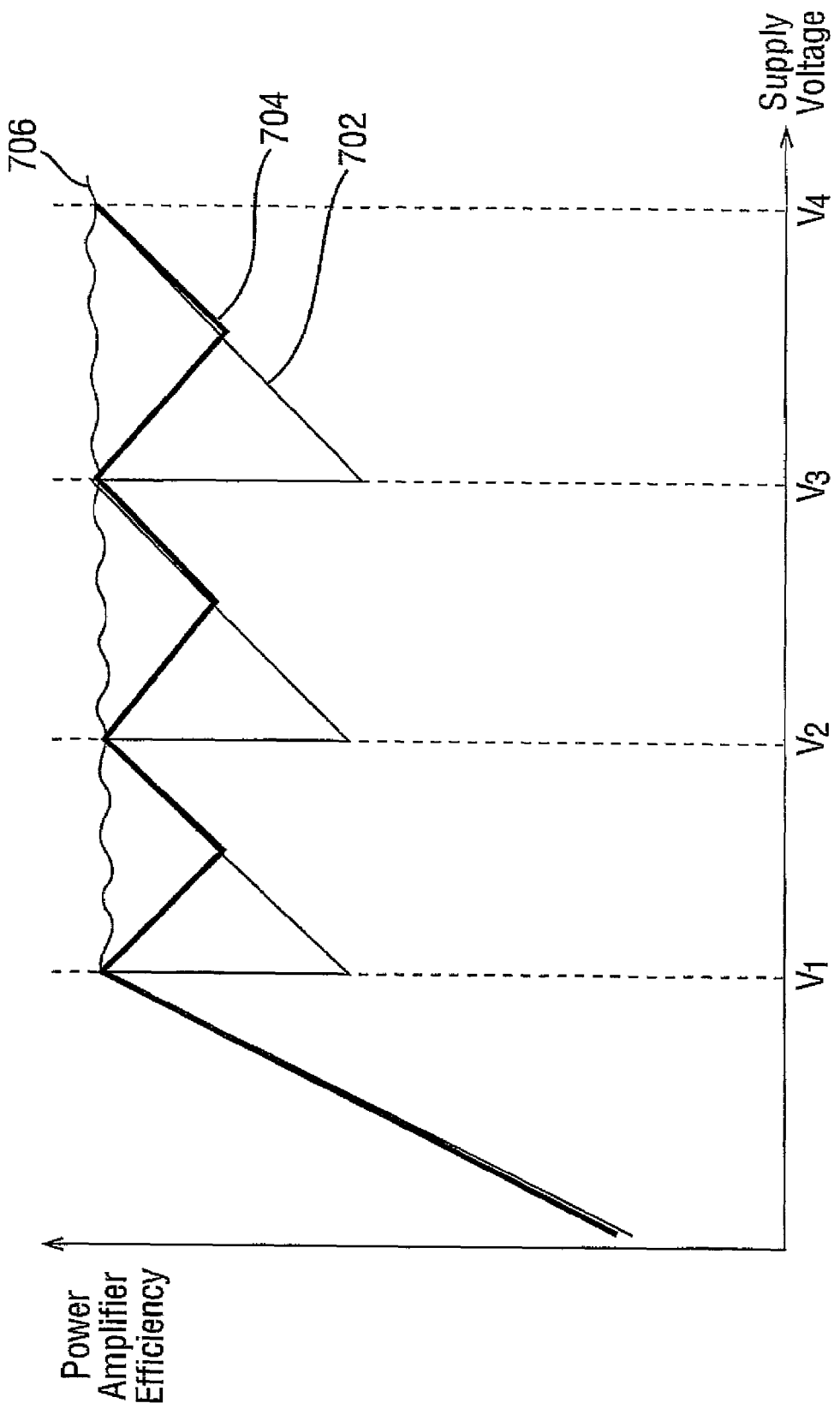
FIG. 9 illustrates the efficiency improvement of an RF amplification stage in accordance with the implementation of FIG. 1.

Finally, referring to FIG. 9, there is illustrated the efficiency improvement provided in accordance with the present invention. FIG. 9 illustrates a plot of power amplifier efficiency against power amplifier supply voltage. As can be seen, the thick line 704 represents the supply voltage switching in accordance with the present invention, whereas the thin line 702 represents the range in power supply voltage achieved in the prior art.

Curve 706 of FIG. 9 illustrates the significant advantage which can be achieved when multiple supply voltages are used including the implementation of amplifier 312 as a Class G amplifier. As more supply voltages are provided, then the drop in efficiency between supply voltage levels is more of a ripple than the 'sawtooth' waveform 704 achieved with a small number of power supplies.

The RF amplifier 102 preferably drives an RF load such as an antenna.

The present invention has been described herein by way of reference to particular preferred embodiments. However the invention is not limited to such embodiments. The present invention has p1 articular application in relation to RF amplifiers, but is not limited to such implementation. The invention can be advantageously utilized in any environment where switched, selectable voltage supplies are provided.

The described preferred embodiments utilizing an RF amplifier are not limited to any particular load being driven by such RF amplifier. However it is envisaged that such an RF amplifier will typically drive an antenna. As such, the present invention has particularly advantageous uses in the field of communications, including the field of mobile communications.

What is claimed is:

1. A power supply stage, comprising:
   a. reference means for providing a reference signal representing a desired power supply voltage;
   b. selection means for selecting one of a plurality of power supply voltages in dependence on the reference signal, the selection means being adapted for selecting a power supply voltage above and below the reference signal, in dependence on the value of the reference signal;
   c. adjusting means adapted to generate an adjusted selected power supply voltage tracking the reference signal in dependence on the selected power supply voltage and the reference signal.

2. A power supply stage according to claim 1 wherein the power supply stage is for an amplifier, the reference signal representing the envelope of an input signal of said amplifier.

3. A power supply stage according to claim 2 in which there is provided a delay element for compensating for differences in delays between the signal amplifier and power supply control input.

4. A power supply stage according to claim 1 wherein the adjusting means includes an AC amplifier.

5. A power supply according to claim 4 wherein the selected power supply voltage has a minimum absolute difference between said power supply voltage and the reference signal level.

6. A power supply stage according to claim 4 wherein the ac amplifier is connected to amplify the difference between the reference signal and a representation of the selected power supply voltage.

7. A power supply stage according to claim 6 wherein the adjusting means includes means for summing the amplified difference with the selected supply voltage.

8. A power supply stage according to claim 7, wherein the representation of the selected power supply voltage is the power supply voltage itself.

9. A power supply stage according to claim 7 wherein the representation of the selected power supply voltage is the adjusted selected power supply voltage.

10. A power supply stage according to claim 4 wherein the adjusting means further includes a high frequency amplifier.

11. A power supply stage according to claim 10 wherein the high frequency amplifier is connected to amplify the difference between the reference signal and a representation of the adjusted power supply voltage.

12. A power supply stage according to claim 11 wherein the adjusting means includes means for summing the amplified difference with the adjusted supply voltage to generate a further adjusted supply voltage.

13. A power supply stage according to claim 12 wherein the representation of the adjusted supply voltage is the adjusted supply voltage itself.

14. A power supply stage according to claim 12 wherein the representation of the adjusted supply voltage is the further adjusted supply voltage.

15. A power supply stage according to claim 12 wherein the further adjusted supply voltage forms the output of the power supply stage.

16. A power supply stage according to claim 4 wherein there is further provided means for DC clamping the AC amplifier.

17. A power supply stage according to claim 16 wherein the means for DC clamping is responsive to detection of the reference signal being less than the adjusted supply voltage.

18. A power supply stage according to claim 4 wherein there is further provided slow DC adjustment means for removing a DC component from the AC amplifier.

19. A power supply stage according to claim 1 wherein the adjusted selected supply voltage is the output of the power supply stage.

20. A power supply stage according to claim 1 in which there is further provided an interpolation means at the input to the adjusting means such that the selected power supply voltage is interpolated.

21. A power supply stage according to claim 20 wherein the interpolation means comprises an inductor-capacitor arrangement.

22. A power supply stage according to claim 1 in which there is provided a delay element for delaying the reference signal.

23. A power supply stage according to claim 1 in which the adjusting means comprises a plurality of cascaded correction circuits.

24. A power supply according to claim 23 in which the adjusting means comprises two or more cascaded correction circuits.

25. A radio frequency amplification stage comprising:
    a. an amplifier for receiving an input signal to be amplified and a power supply voltage; and
    b. a power supply voltage stage for supplying said power supply voltage, comprising:
       i. means for providing a reference signal representing a desired power supply voltage corresponding to the envelope of the input signal;
       ii. means for selecting one of a plurality of supply voltage levels in dependence on the reference signal, the means for selecting being adapted for selecting the supply voltage level above and below the reference signal; and
       iii. means for generating an adjusted selected power supply voltage, comprising an AC amplifier for amplifying a difference between the reference signal and one of the selected supply voltage level or the adjusted selected supply voltage level, and a summer for summing the amplified difference with the selected supply voltage to thereby generate the adjusted supply voltage.

26. A radio frequency amplification stage according to claim 25 in which the means for generating an adjusted selected supply voltage further generates a further adjusted supply voltage and further comprises an RF amplifier for amplifying a difference between the reference signal and one of the adjusted supply voltage or the further adjusted supply voltage, and a summer for summing such amplified difference with the adjusted supply voltage to thereby generate the further adjusted supply voltage.

27. A radio frequency amplification stage according to claim 25 wherein one of the adjusted supply voltage or further adjusted supply voltage forms the supply voltage to the amplifier.

28. A method of controlling a power supply stage, comprising:
   a. providing a reference signal representing a desired power supply voltage;
   b. selecting one of a plurality of power supply voltages in dependence on the reference signal, the selecting step being adapted for selecting a power supply voltage above and below the reference signal, in dependence on the value of the reference signal;
   c. generating an adjusted selected power supply voltage tracking the reference signal in dependence on the selected power supply voltage and the reference signal.

29. A method according to claim 28 wherein the reference signal represents the envelope of an input signal to an amplifier, the power supply stage providing a power supply to said amplifier.

30. A method according to claim 28 wherein the difference between the reference signal and a representation of the selected power supply voltage is AC amplified.

31. A method according to claim 30 wherein the amplified difference is summed with the selected supply voltage to form the adjusted supply voltage.

32. A method according to claim 31 wherein the difference between the reference signal and a representation of the adjusted power supply voltage is RF amplified.

33. A method according to claim 32 wherein the amplified difference is summed with the adjusted supply voltage to form a further adjusted supply voltage.

34. A method according to claim 30 further comprising providing means for removing a dc component in the AC amplification step.

35. A method according to claim 28 further comprising an interpolating step prior to said step of generating an adjusted supply voltage.

36. A power supply stage, comprising:
   a. an envelope detector for providing a reference signal representing a desired power supply voltage;
   b. a supply voltage selection block for selecting one of a plurality of power supply voltages in dependence on the reference signal, the supply voltage selection block being adapted for selecting a power supply voltage above and below the reference signal in dependence on the value of the reference signal;
   c. a supply voltage adjustment block adapted to generate an adjusted selected power supply voltage tracking the reference signal in dependence on the selected power supply voltage and the reference signal.

37. A radio frequency amplification stage comprising:
   a. an amplifier for receiving an input signal to be amplified and a power supply voltage; and
   b. a power supply voltage stage for supplying said power supply voltage, comprising:
      i. an envelope detector for providing a reference signal representing a desired power supply voltage corresponding to the envelope of the input signal;
      ii. a supply voltage selection block for selecting one of a plurality of supply voltage levels in dependence on the reference signal, the supply voltage selection block being adapted for selecting a supply voltage level above and below the reference signal; and
      iii. a supply voltage adjustment block for generating an adjusted selected power supply voltage, comprising an AC amplifier for amplifying a difference between the reference signal and one of the selected supply voltage level or the adjusted selected supply voltage level, and a summer for summing the amplified difference with the selected supply voltage to thereby generate the adjusted supply voltage.

38. A power supply stage, comprising:
reference means for providing a reference signal representing a desired power supply voltage;
selection means for selecting one of a plurality of power supply voltages in dependence on the reference signal, the selection means being adapted for selecting a power supply voltage below the reference signal, in dependence on the value of the reference signal; and
adjusting means adapted to generate an adjusted selected power supply voltage tracking the reference signal in dependence on the selected power supply voltage and the reference signal.

39. A power supply stage according to claim 38, the selection means being adapted for selecting a power supply voltage such that the power supply voltage tracks above and below the reference signal.

40. A method of controlling a power supply stage, comprising:
providing a reference signal representing a desired power supply voltage;
selecting one of a plurality of power supply voltages in dependence on the reference signal, the selecting step being adapted for selecting a power supply voltage below the reference signal, in dependence on the value of the reference signal; and
generating an adjusted selected power supply voltage tracking the reference signal in dependence on the selected power supply voltage and the reference signal.

41. A method according to claim 40, the selecting step being adapted for selecting a power supply voltage such that the power supply voltage tracks above and below the reference signal.

42. A power supply stage, comprising:
an envelope detector for providing a reference signal representing a desired power supply voltage;
a supply voltage selection block for selecting one of a plurality of power supply voltages in dependence on the reference signal, the supply voltage selection block being adapted for selecting a power supply voltage below the reference signal in dependence on the value of the reference signal; and
a supply voltage adjustment block adapted to generate an adjusted selected power supply voltage tracking the reference signal in dependence on the selected power supply voltage and the reference signal.

43. A power supply stage according to claim 42, the selection means being adapted for selecting a power supply voltage such that the power supply voltage tracks above and below the reference signal.

* * * * *